Figures 1, 2:
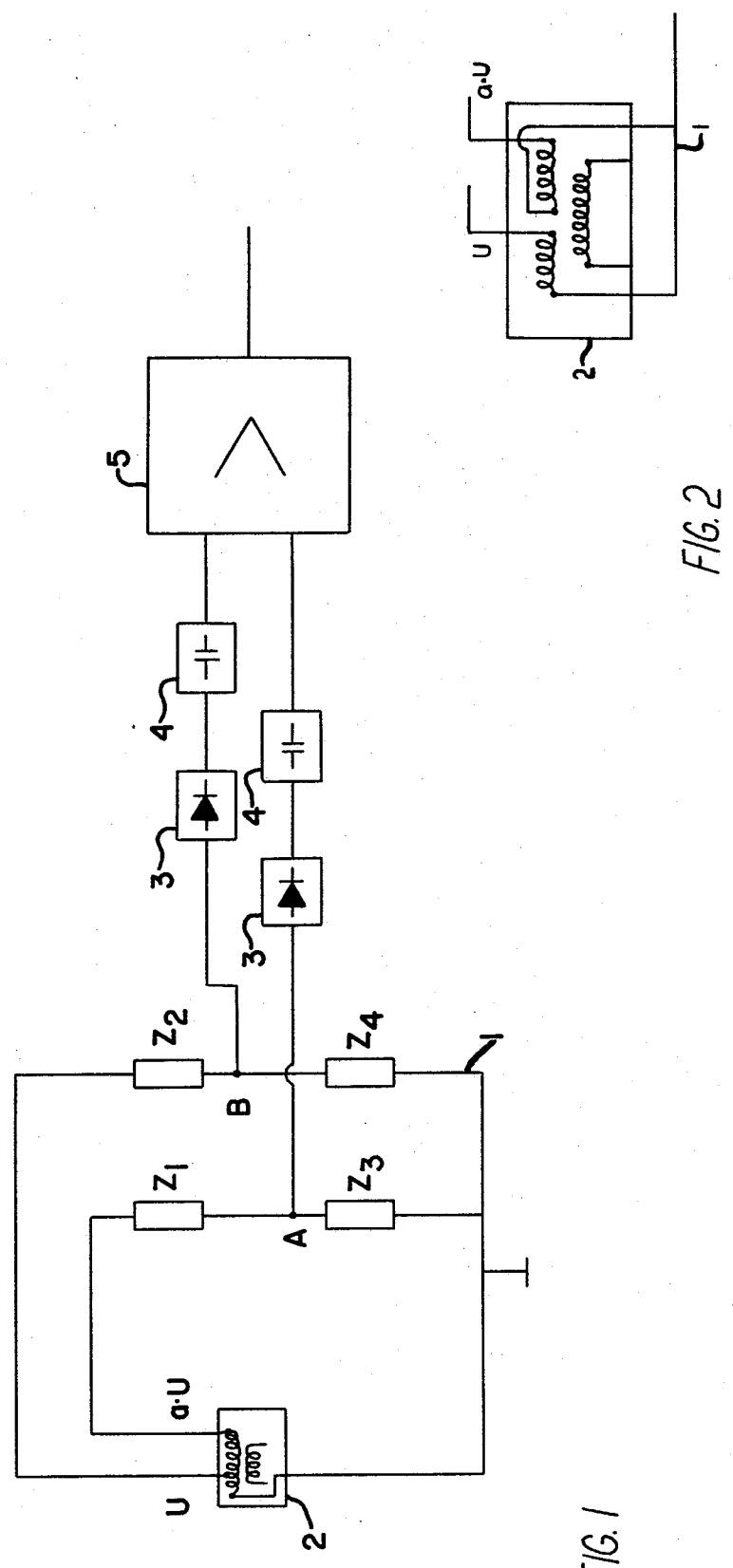

United States Patent [19]

Schierjott

[11] 4,449,093
[45] May 15, 1984

[54] CIRCUIT FOR MEASURING ELECTRICAL PROPERTIES

[76] Inventor: Günter Schierjott, Lorenz-Rebbert-Allee 1, 4630 Bochum 1, Fed. Rep. of Germany

[21] Appl. No.: 306,503

[22] Filed: Sep. 28, 1981

[30] Foreign Application Priority Data

Oct. 8, 1980 [DE] Fed. Rep. of Germany ....... 3037925

[51] Int. Cl.³ ............................................ G01R 27/00
[52] U.S. Cl. ................................................ 324/57 R
[58] Field of Search ............. 324/DIG. 1, 57 R, 60 C

[56] References Cited

FOREIGN PATENT DOCUMENTS 824065 4/1981 U.S.S.R. ........................... 324/57 R

OTHER PUBLICATIONS

Pruna et al.: "Vectorial Impedance Meter"–Metrologia Aplicata, vol. XXVI, NR 3; 1979, pp. 123–128.
Oliver et al.: "Electronics Measurements and Instrumentation", McGraw-Hill-1972-p. 278.

Primary Examiner—Stanley T. Krawczewicz
Assistant Examiner—Jose M. Solis
Attorney, Agent, or Firm—Thomas H. Murray; Clifford A. Poff

[57] ABSTRACT

A circuit for measuring electrical properties such as the resistance, capacitance and inductance includes two bridge branches each having at least two serially-connected components which can comprise resistors, capacitors and inductors or combinations thereof. One of the components is variable with respect to its resistance by means of a quantity which is under measurement. The bridge branches are connected to different voltage outputs of a common alternating current supply. The diagonal points between serially-connected components in each of the bridge branches serve as measuring points for a measurable signal. Each measuring point may be connected by a line having a rectifier followed by a capacitor forming an electronic store such that at the output of the stores there is a direct current potential forming the measurable signal.

4 Claims, 2 Drawing Figures

CIRCUIT FOR MEASURING ELECTRICAL PROPERTIES

BACKGROUND OF THE INVENTION

This invention relates to a circuit for measuring electrical properties such as the resistance, capacitance and inductance. More particularly, the present invention relates to such a circuit including a bridge circuit having a component which varies with the quantity under measurement.

In known constructions of bridge circuits, the resistances of bridge branches are balanced with respect to one another as far as possible. Only minor variations are permitted to the resistance which is measurement-dependent for a direct evaluation of the diagonal voltage. In a so-called zero method, an imbalance to the diagonal voltage produced by a variation to the measurement-dependent component causes a corresponding variation at another component in the bridge circuit until the diagonal voltage is again zero. The variation in the additional component is the measurement signal. In both forms of the above-measuring bridges, the bridge branches are fed from a common voltage supply. For an adequately-accurate measurement, the known constructions of measuring bridges require a large capital outlay for components to achieve the compensation required for measuring the variation. Otherwise, the measuring bridge can be used only in a small measurement range of resistance.

SUMMARY OF THE INVENTION

It is an object of the present invention to provide a circuit for measuring an electrical property in a very simple manner by converting a considerable resistance variation of a component in a bridge circuit to a proportional or inversely-proportional variation to the diagonal voltage of the bridge circuit when the diagonal voltage is zero for resistances of the variable component which are small or large in comparison with the resistances of other components in the bridge circuit.

It is a further object of the present invention to provide such a bridge circuit according to the preceding object for measuring the resistance of a variable component closely approaching a zero value or an infinite value.

According to the present invention there is provided a circuit for measuring an electrical property such as the resistance, capacitance or inductance of a circuit component, the circuit including two bridge branches each having at least two serially-connected components, one bridge branch having a variable resistance bridge component representing an electrical property under measurement, a common voltage supply having two supply outputs each at a different voltage, each bridge branch being connected to one of the two supply outputs such that the voltage applied to the bridge branch without the variable resistance bridge component differs from the voltage applied to the other bridge branch by a factor, and means to detect the voltage difference at measuring points between the serially-connected components of the bridge branches for providing a measurable signal.

In the preferred form of the present invention, the aforesaid factor is made larger than 1 to simplify conditions of the circuit. According to a further aspect of the present invention, the common voltage supply consists of an alternating current supply including a transformer having an input winding and an output winding, the output winding having taps such that a higher voltage can be tapped off between the beginning and the end points of the output winding while a smaller voltage can be tapped off between the beginning point and a tap along the output winding.

It may also be advantageous to provide a common voltage supply comprising an alternating current supply including a transformer having one input and two output windings, the number of turns in the output windings differing by the aforesaid factor. When the bridge circuit contains complex components, it is advantageous to expand the circuit so that the effect of a phase shift caused by complex components on the measurable signal is eliminated. To this end, two rectifiers are provided, each connected to one of the aforementioned measuring points between the serially-connected components of the bridge branches. Each rectifier is followed by an electronic store, e.g., a capacitor. The difference between the direct current potentials at the outputs of the stores provides the aforesaid measurable signal.

It may also be advantageous to connect the rectifiers in a known manner to an impedance transformer circuit in order to obtain resistance decoupling between the bridge branch components and the electronic stores.

The circuit, according to the present invention, offers several main advantages which includes a rugged and simple circuit construction substantially free of complicated electronic and electromechanical components which are susceptible to trouble. The circuit offers the further advantage that a zero signal is independent of fluctuations to the voltage supply. The circuit is also distinctive in that extreme resistances approaching zero and infinity are permissible for the variable component in the bridge branch. Both proportional and inversely-proportional resistance characteristics of the variable resistance component can be converted to a proportional variation of the measurable signal in a dependent relation on the electrical property whichh is to be measured.

The circuit of the present invention can also be arranged so that the bridge branches contain a number of variable components, such as resistors, capacitors and inductors and/or combinations thereof. When the circuit is operated with an alternating current, the circuit has the advantages that phase shifts are eliminated and that the potential of the resulting direct current voltage can be dealt with, e.g., processed, more easily by the use of modern semiconductor technology than potentials of alternating current. The circuit can be used for all frequencies and for all voltage forms such as sine, square, triangular and sawtooth waveforms.

These features and advantages of the present invention as well as others will be more readily understood when the following description is read in light of the accompanying drawing, in which:

FIG. 1 illustrates one form of a circuit for measuring electrical properties according to the present invention; and FIG. 2 illustrates a second embodiment of an alternating current power supply used in place of the current supply forming part of the circuit in FIG. 1.

In FIG. 1, there is illustrated a circuit for measuring electrical properties such as the resistance, capacitance and inductance. The circuit includes a bridge circuit 1 having four components $Z_1$, $Z_2$, $Z_3$ and $Z_4$. The resistance of at least one of these components is variable by means of the electrical property under measurement. The bridge 1 is fed from an alternating current supply 2. The supply 2 includes an output to supply a voltage U to the bridge branch containing components $Z_2$ and $Z_4$ and an output to supply a voltage aU to the bridge branch containing components $Z_1$ and $Z_3$. The difference between the voltage potential at the diagonal points A and B of the circuit forms the measurable signal $\Delta U$.

The following equation applies to the difference between the voltage potentials at points A and B:

$$\Delta U = U_{AB} = U\left(a\frac{Z_3}{Z_1 + Z_3} - \frac{Z_3}{Z_2 + Z_4}\right)$$

According to this equation, for example, if $$a = \frac{Z_1 + Z_3}{Z_3},$$

then the voltage difference $U_{AB}$ is inversely proportional to the resistance variation of $Z_4$. The bridge circuit can thus be advantageously used for measurements of an electrical quantity represented as a variation in the resistance of the measuring bridge. The resistance varies with inverse proportion of the value of the measured quantity. The voltage difference $U_{AB}$ is thus directly proportional to the measured quantity.

The circuit of the present invention can also be used when component $Z_2$ is variable by means of the measured quantity and/or the voltage difference $U_{BA}$ representing the measured signal.

To prevent a phase shift caused by the use of complex components from affecting the measured signal, two measuring lines are provided, each connected to one of the diagonal points A, B of the bridge circuit 1. Each measuring line includes a rectifier 3 followed by a store, e.g., a capacitor. An amplifier 5 is connected at the end points of the two measuring lines for further processing of direct current potentials. Full-wave or half-wave rectifiers may be used.

The voltage potentials at the diagonal points A, B of bridge circuit 1 are converted to direct current potentials by the rectifiers 3. The direct current potentials are fed to the stores 4 which charge up to the relevant peak potential. The potential remains at this level for a time due to the barrier effect of the rectifiers in the rearward direction. The direct current potentials at the outputs of the stores 4 are thus no longer influenced by the phase shift of the voltage potentials across the diagonal points A, B of the bridge circuit 1.

The circuit according to the present invention has practical application for temperature measurement using pick-ups having a wide variation of resistance which is to be measured with high accuracy and reliability in a permitted measuring range. This is particularly desirable with the use of semiconductors having resistances with a high negative temperature coefficient. As a result of these properties of the circuit, it is a simple matter to convert a temperature measurement into a directly proportional voltage.

Another practical application of the circuit of the present invention is a conductivity measurement of an aqueous electrolyte solution using known conductivity transmitters. The electrical resistance of the solution is inversely proportional to its conductivity. Here, again, it is a simple matter to convert the electrical conductivity into a directly proportional voltage.

In still another application of the circuit of the present invention, the bridge circuit can be used to measure the capacitance or inductance of complex resistors. In this application, one of the components $Z_2$ or $Z_4$ is constructed as an oscillatory circuit of infinite resistance or of zero resistance. If a complex rectifier is now connected appropriately in parallel or in series with this oscillatory circuit, it no longer oscillates at the resonant frequency. The detuning results in a considerable variation to the resistance of the oscillatory circuit connected as a bridge resistor. This is true even in the case of small changes from the resonant frequency. The value of the differential voltage, $\Delta U$, is thus directly proportional to the value of the complex resistor. The slope of the resonant curve thus enables measurement of very small complex resistances in a simple manner.

In FIG. 2, there is illustrated a second embodiment of a voltage supply which can be used in place of the embodiment of the transformer forming part of the voltage supply 2 illustrated in FIG. 1. In FIG. 2, the voltage supply includes a transformer having a primary winding and two secondary windings. The difference in number of turns in the secondary windings differs by a factor a which corresponds to the voltage difference applied to the bridge branches.

Although the invention has been shown in connection with certain specific embodiments, it will be readily apparent to those skilled in the art that various changes in form and arrangements of parts may be made to suit requirements without departing from the spirit and scope of the invention.

I claim as my invention:

1. A circuit for measuring an electrical property, such as the resistance, capacitance or inductance of a circuit component, said circuit including two bridge branches each having at least two serially-connected components, one bridge branch having a variable resistance bridge component representing an electrical property under measurement, a common voltage supply having two supply outputs each at a different voltage, each bridge branch being connected to one of said two supply outputs such that the voltage applied to the bridge branch without said variable resistance bridge component differs from the voltage applied to the other bridge branch by a factor, and means to detect the voltage difference at measuring points between the serially-connected components of the bridge branches for producing a measurable signal, said means to detect eliminating the effect of a phase shift caused by complex components upon said measurable signal, said means to detect including two rectifiers each connected to one of said measuring points, electrical storage means receiving the output from said rectifiers for providing direct current outputs defining said measurable signal.

2. The circuit according to claim 1 wherein said factor is greater than 1.

3. The circuit according to claim 1 wherein said common current supply includes a transformer having a primary winding and a secondary winding, said secondary winding having high voltage taps at the winding end points, and lower voltage taps at an end point and between said winding end points.

4. The circuit according to claim 1 wherein said common voltage supply comprises an alternating current supply including a transformer having an input winding and two output windings each forming one of said two supply outputs, said two output windings having a different number of turns which differ by said factor.

* * * * *